(12) United States Patent
Brenna et al.

(10) Patent No.: US 10,643,950 B2
(45) Date of Patent: *May 5, 2020

(54) INDEXING OF ELECTRONIC DEVICES WITH MULTIPLE WEIGHT MARKERS

(71) Applicant: STMicroelectronics S.r.l., Agrate Brianza (IT)

(72) Inventors: Emanuele Brenna, Agrate Brianza (IT); Antonio Di Franco, Osnago (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

This patent is subject to a terminal disclaimer.

(21) Appl. No.: 14/691,200

(22) Filed: Apr. 20, 2015

(65) Prior Publication Data

US 2015/0228589 A1 Aug. 13, 2015

Related U.S. Application Data

(63) Continuation of application No. 12/900,994, filed on Oct. 8, 2010, now Pat. No. 9,076,799.

(30) Foreign Application Priority Data

Oct. 9, 2009 (IT) .............................. MI2009A1728

(51) Int. Cl.
*H01L 21/82* (2006.01)
*H01L 23/544* (2006.01)

(52) U.S. Cl.
CPC ............ *H01L 23/544* (2013.01); *H01L 21/82* (2013.01); *H01L 2223/5442* (2013.01);
(Continued)

(58) Field of Classification Search
CPC .......... H01L 2223/5449; H01L 23/544; H01L 23/54; H01L 21/82
(Continued)

(56) References Cited

U.S. PATENT DOCUMENTS 5,350,715 A 9/1994 Lee
7,348,682 B2 * 3/2008 Brambilla et al. ............ 257/797
(Continued)

FOREIGN PATENT DOCUMENTS

DE 102006006300 A1 8/2007

OTHER PUBLICATIONS

EPO Rule 71(3) (intention to grant) for co-pending EP Appl. No. 10186952.7 dated Jun. 13, 2018 (33 pages).
(Continued)

*Primary Examiner* — Monica D Harrison
(74) *Attorney, Agent, or Firm* — Crowe & Dunlevy

(57) ABSTRACT

A die has a positional location in a wafer defined by first and second coordinates, the first and second coordinates identifying a respective horizontal and vertical location where the die was formed. An index formed on the die has a first comb structure of a first contiguous arrangement of first dots, and a second comb structure of a second contiguous arrangement of second dots. A first marker at a selected one of the first dots indicates a first digit of the first coordinate, and a first additional marker at a selected one of the first dots indicates a second digit of the first coordinate. A second marker at a selected one of the second dots indicates a first digit of the second coordinate, and a second additional marker at a selected one of the second dots indicates a second digit of the second coordinate.

24 Claims, 7 Drawing Sheets

(52) U.S. Cl.
CPC ............ *H01L 2223/5448* (2013.01); *H01L 2223/54406* (2013.01); *H01L 2223/54413* (2013.01); *H01L 2223/54433* (2013.01); *H01L 2924/0002* (2013.01)

(58) Field of Classification Search
USPC .......................................... 257/40
See application file for complete search history.

(56) References Cited

U.S. PATENT DOCUMENTS

| | | |
|---|---|---|
| 9,076,799 B2 * | 7/2015 | Brenna ............ H01L 23/544 |
| 2003/0127718 A1 | 7/2003 | Haag |
| 2005/0275068 A1 | 12/2005 | Brambilla et al. |
| 2008/0153250 A1 | 6/2008 | Brambilla et al. |
| 2011/0073966 A1 | 3/2011 | Freguglia et al. |

OTHER PUBLICATIONS

Italian Search Report and Written Opinion dated Jun. 24, 2010 from IT Appl. No. MI2009A001728.
EPO Search Report dated Dec. 16, 2010 from EP Appl. No. 10186952.7.
EPO Communication dated Dec. 16, 2010 from EP Appl. No. 10186952.7.

* cited by examiner

INDEXING OF ELECTRONIC DEVICES WITH MULTIPLE WEIGHT MARKERS

RELATED APPLICATIONS

This application is a continuation of U.S. patent application Ser. No. 12/900,994, filed on Oct. 8, 2010, entitled "Indexing of Electronic Devices with Multiple Weight Markers," which claims the priority benefit of Italian patent application number MI2009A001728, filed on Oct. 9, 2009, entitled "Indexing of Electronic Devices with Multiple Weight Markers," both of which are hereby incorporated by reference.

BACKGROUND OF THE INVENTION

The solution according to one or more embodiments of the present invention generally relates to the electronic field. More specifically, this solution relates to the indexing of electronic devices.

Electronic devices are generally integrated in dice, which are formed in a large number of portions of a wafer. Particularly, in a production process of the stepper shot type, each stage of the production process is not performed concurrently on the whole wafer, but step by step repeating the same operations on different shot areas thereof (by moving a smaller photolithographic mask accordingly).

In this context, it is of the utmost importance to be able to determine the original position of the dice of the electronic devices in the wafer (before their separation). For example, this information is very useful for a quality management of the production process. Indeed, several characteristics of the electronic devices (for example, their functional parameters, performance and reliability) depend significantly on the position of the corresponding dice in the wafer (for example, because of changes in the crystallographic structure of the wafer through its extent). Therefore, when some electronic devices are subject to failures during their operation and are then returned to a corresponding manufacturer, the knowledge of their position in the wafer facilitates the analysis of the failures and the development of corresponding improvements in their production process. The same information may also be useful during a test of the electronic devices at the wafer level, known as Electrical Wafer Sorting (EWS). Indeed, in this way it is possible to store the position of any defective electronic devices that did not pass the test, so that they may be identified and discarded after the corresponding dice have been cut (without the need of marking the dice of the defective electronic devices during the test to discriminate them—for example, with ink dots).

For this purpose, it is known in the art to form an index on each die (when it is still included in the wafer), which index indicates the position of the die in the wafer. Particularly, in the case of the production process of the stepper shot type, the index has a composite structure with a shot index (indicating the position of the corresponding shot area in the wafer) and a die index (indicating the position of the die in the corresponding shot area). Typically, each (shot and die) index is defined by a row index and a column index, which define a row coordinate and a column coordinate, respectively, in a corresponding matrix. Particularly, a generic index may be implemented with a ruler (for example, being formed in a surface metallic layer of the die), which ruler defines an ordered alignment of locations (referred to as dots) each one associated with a corresponding number; a marker selects a specific dot (for example, by means of the erasure of a corresponding portion of the metallic layer), and then the corresponding number. In this case, the die indexes and the rulers of the shot indexes of all the dice may be formed during a selected stage of the production process by means of a corresponding mask (which replicates the same structures in the different shot areas); the markers of the shot indexes are instead formed by exploiting an additional mask (designed to form them at the same position in all the corresponding dice), which additional mask is however slightly displaced at every shot so as to form these markers at different positions in every shot area. An example of the above-mentioned indexing technique is described in United States Patent Publication No. 2008/0153250, which is hereby incorporated by reference.

A drawback of the indexing techniques known in the art is their limitation in the number of dice that can be indexed in the same wafer. Indeed, the dots of the rulers cannot be smaller than a minimum size (for example, 1 µm×1 µm), in order to allow their correct inspection; in addition, the area of the dice that can be used to form each ruler is constrained (for example, with a length of 15 µm). As a result, the maximum value of each row and column index is relatively low (about 15 µm/1 µm=15), with a corresponding limitation in the range of each shot and die index (15×15=225 in the example at issue). This drawback is particularly acute in the die indexes, since the modern production processes easily exceed the above-mentioned number of dice in each shot area; in this case, it is not possible to implement any indexing of the dice (with a detrimental effect on the quality of the corresponding production process).

Different indexing techniques are also known in the art. For example, in Japanese Application 10012527, hereby incorporated by reference, each index is represented with a binary code; the bits of the index are defined in corresponding locations (arranged along a straight line) to the value 1 in presence of a predefined slit or to the value 0 in its absence. The same document also describes other embodiments wherein the index is represented with a number in a base higher than 2; particularly, the digits of the index are represented by the length multiple of a predefined value of corresponding teeth (in this case, with the index that has a variable length), or by the depth multiple of a predefined value of slits at the corresponding locations, with the value 0 that is represented by the absence of any slit (in this case, with the slits that extend transversally to the arrangement of the locations).

Alternatively, in Japanese Application 61142734, incorporated by reference, each bit of the index is represented by the length of a corresponding bar (a long bar for the value 0 and a short bar for the value 1).

Moreover, in United Stated Patent Application No. 2003/127718, incorporated by reference, each bit of the index is represented at a corresponding location by the presence or the absence of a recess.

SUMMARY OF THE INVENTION

In its general terms, the solution according to one or more embodiments of is based on the idea of using more markers with different weights (for the definition of a corresponding index).

Particularly, one or more aspects of a solution according to specific embodiments are set out in the independent claims. Advantageous features of the same solution are set out in the dependent claims.

More specifically, an aspect of a solution according to an embodiment comprises an electronic device, which includes a die integrating an electronic circuit. The die has at least one index; the index includes a reference defining an ordered alignment of a plurality of locations on the die (for example, a ruler with a comb-like structure), and marker means for defining a value of the index according to an arrangement of the marker means with respect to the reference (in other words, the locations are placed in a straight linear arrangement, wherein a line best fitting them is straight). In the solution according to an embodiment, the marker means includes a plurality of markers each one arranged at a selected one of the locations; the selected location of the marker defines a value of a digit associated with a corresponding power of a base (higher than 2) within a number in a positional notation in said base, which number represents the value of the index (for example, in a decimal notation with a marker for the units digit and a marker for the tens digits, each one associated with a corresponding subset of adjacent locations along the ruler).

A different aspect of a solution according to an embodiment comprises a corresponding indexing method (with the same advantageous features recited in the dependent claims for the electronic device that apply mutatis mutandis to the method).

A further aspect of a solution according to an embodiment comprises a software program including code means for causing a processing system (for example, a stepper) to perform the steps of this method when the software program is executed on the processing system; a still further aspect of the solution according to an embodiment proposes a software program product including a non-transitory computer readable medium embodying a software program, the software program including code means directly loadable into a working memory of a processing system thereby configuring the processing system to perform the same method.

BRIEF DESCRIPTION OF THE DRAWINGS

A solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references and their explanation is not repeated for the sake of brevity, and the name of each entity is generally used to denote both its type and its attributes—such as its value, content and representation—for the sake of simplicity). Particularly.

DETAILED DESCRIPTION

Figure 1:
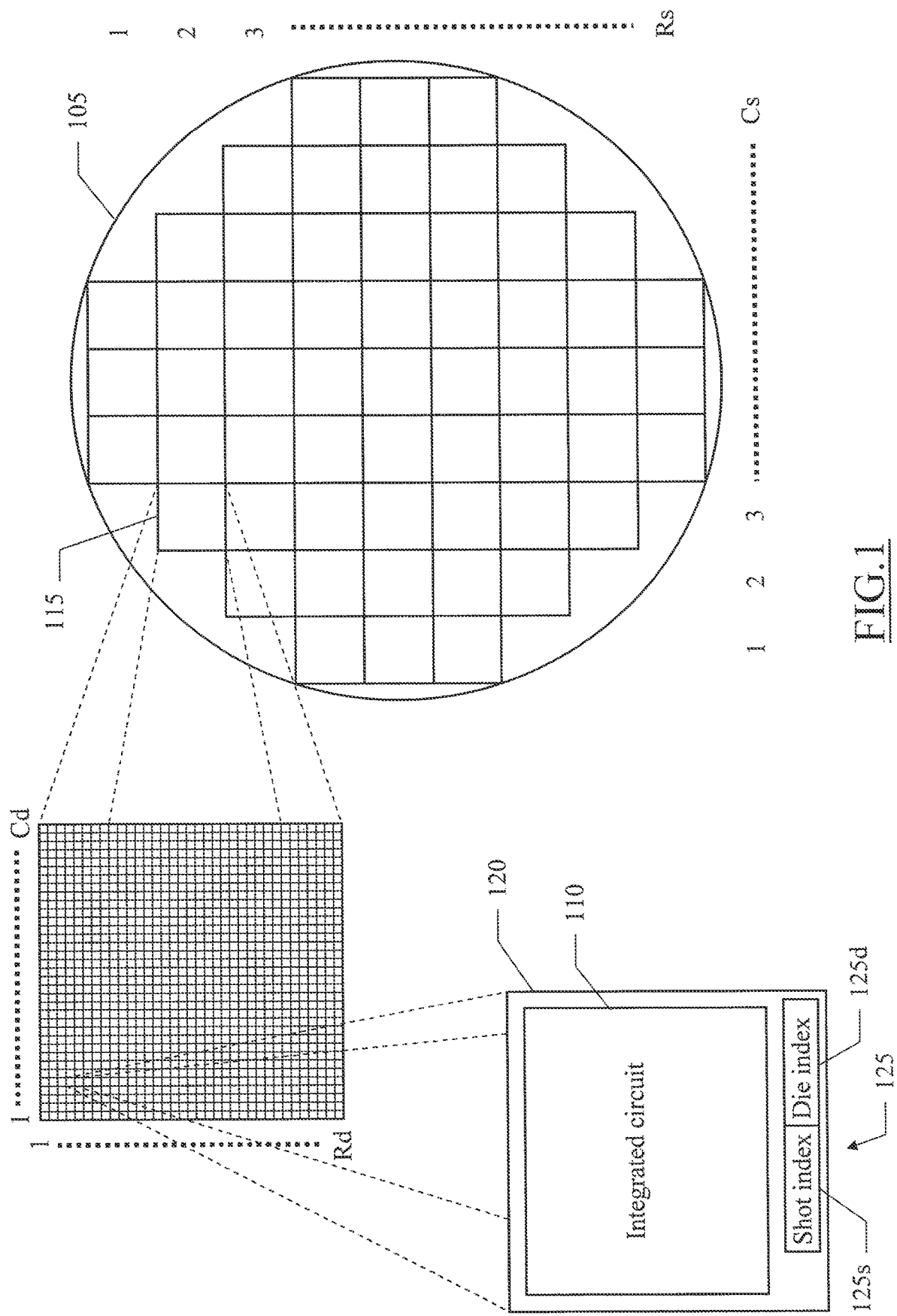
FIG. 1 schematically shows a wafer at an intermediate stage of a production process of electronic devices to which the solution according to an embodiment may be applied.

With reference in particular to FIG. 1, there is schematically shown a wafer 105 at an intermediate stage of a production process of electronic devices, to which a solution according to an embodiment may be applied. The wafer 105 comprises of a circular slice (for example, with a radius of 8 inches), which is mainly made of semiconductor material; an identical electronic circuit 110 is integrated in a large number of portions of the wafer 105 (for example, from some hundreds to some thousands). The production process of these integrated circuits 110 is executed in a sequence of stages, each one involving the patterning of one or more exposed layers of the wafer 105 (for example, made of semiconductor, insulating, and/or conductive material) by means of a corresponding photolithographic mask. Particularly, in a production process of the stepper shot type, at each stage of the production process a mask being smaller than the wafer 105 is used to pattern a corresponding shot area 115 thereof, which only includes a subset of the integrated circuits 110 that are patterned concurrently (with a single shot) according to this mask. The wafer 105 is then moved so as to position another shot area 115 thereof under the mask, and the same operations are repeated for the corresponding integrated circuits 110. The process is reiterated until the whole wafer 105 has been patterned. At the end of the production process, the portions of the wafer 105 (wherein the desired integrated circuits 110 are formed) are cut by means of a sawing operation so as to obtain corresponding dice 120.

Each die 120 also includes (in addition to the corresponding integrated circuit 110) an index 125, which is used to indicate a position of the die 120 in the wafer 105 uniquely. Typically, the index 125 is formed in one of the last layers of the wafer 105, so as to be visible (directly or indirectly) with a non-invasive inspection (for example, optically by means of a low power microscope). Particularly, when the above-described production process of the stepper shot type is used, this (global) index 125 has a composite structure with a shot index $125s$ (which identifies the position of the corresponding shot area 115 in the wafer 105) and a die index $125d$ (which identifies the position of the die 110 in the corresponding shot area 115). The die index $125d$ (being equal for all the dice 110 in the same position within the different shot areas 115) may be formed during a selected stage of the production process by means of a corresponding mask (which replicates the same die indexes $125d$ in the different shot areas 115). Conversely, the shot index $120s$ (changing for the different shot areas 115) is formed by exploiting an additional (service) mask, which creates one or more markers at the same position in all the corresponding dice 120. At every shot, the wafer 105 is slightly displaced with respect to the service mask, so that the markers move accordingly in the dice 120 of the corresponding shot area 115; in this way, the position of the markers in each die 120 (with respect to a predefined reference being formed thereon) allows distinguishing the different shot areas 115. These operations are typically controlled by a software program that manages operation of a stepper being used to create the electronic circuits 110 in the wafer 105 (for example, being installed on a non-volatile memory of a corresponding control unit, for example, from a removable storage device, and loaded at least in part into its working memory when this control program is running).

Typically, the shot areas 115 are arranged in a matrix with Rs rows and Cs columns (for example, Rs=Cs=6-12); therefore, each shot area 115 may be identified in the corresponding shot index $125s$ by a pair of row and column coordinates. Likewise, the dice 120 are arranged in a matrix with Rd rows and Cd columns (for example, Rd=Cd=10-100); therefore, each die 120 may be identified in the corresponding die index $125d$ by another pair of row and column coordinates. For example, the specific die 120 being enlarged in the figure is identified by the shot index $125s=(2,3)$—to indicate the shot area 115 in the 2nd row and the 3rd column of the wafer 105—and by the die index $125d=(4,5)$—to indicate the die 120 in the 4th row and the 5th column of this shot area 115.

Figure 2:
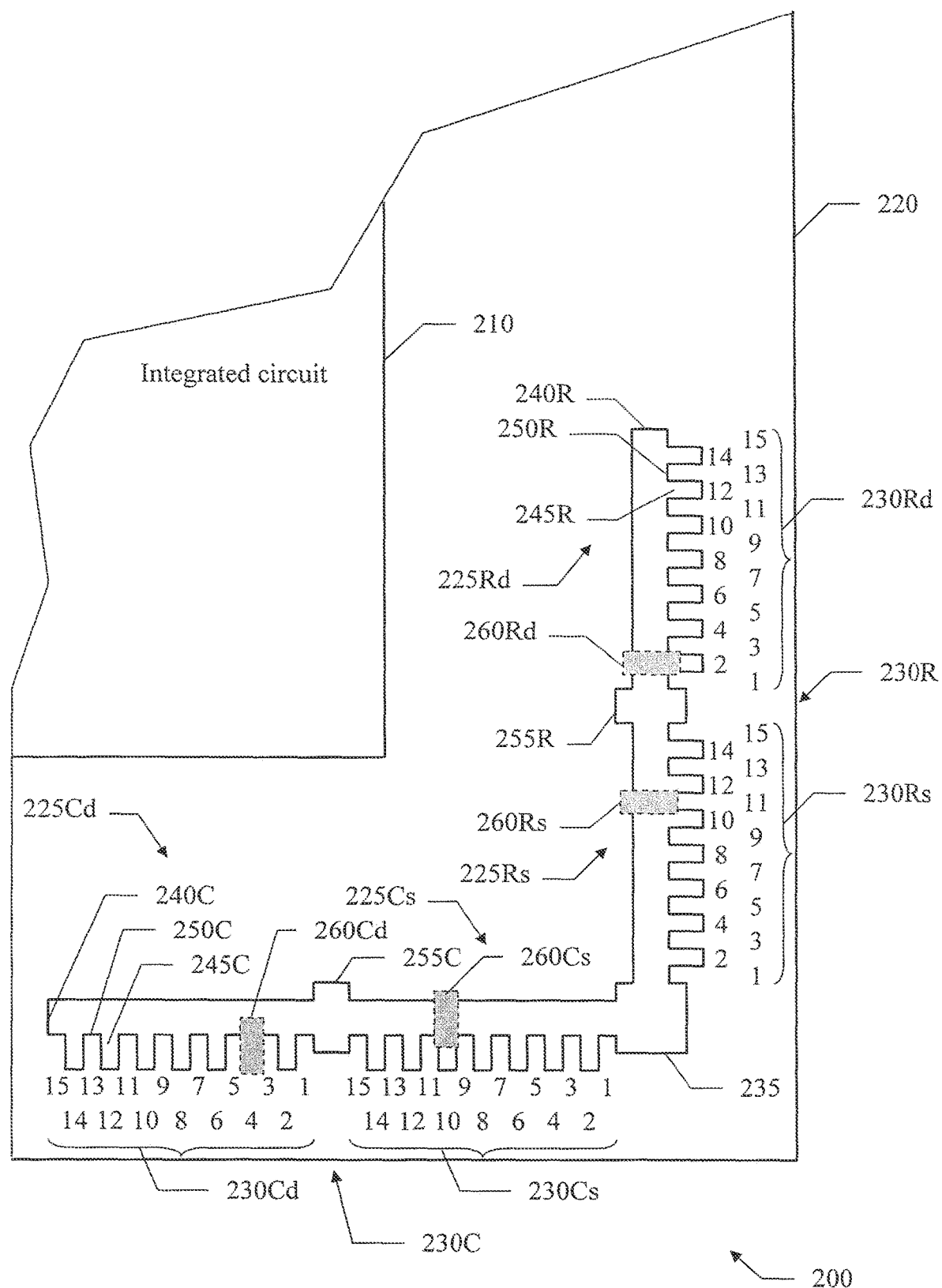
FIG. 2 shows an enlarged portion of an electronic device implementing an indexing scheme known in the art.

An enlarged portion of an electronic device 200 implementing an indexing scheme is shown in FIG. 2. The electronic device 200 includes an integrated circuit 210 that is formed in a die 220; the position of the die 220 in the corresponding wafer (not shown in the figure) is indicated by a (global) index, which includes a (row shot) index 225Rs and a (column shot) index 225Cs—indicating the position of the corresponding shot area in the wafer by means of its row and column, respectively—and a (row die) index 225Rd and a (column die) index 225Cd—indicating the position of the die 210 in the corresponding shot area by means of its row and column, respectively.

More in detail, each index 225Rs,225Cs,225Rd,225Cd includes a reference (for example, made of a reflective material such as metal); this reference is formed by a ruler 230R with a comb-like structure for the (row) indexes 225Rs and 225Rd, and by another ruler 230C for the (column) indexes 225Cs and 225Cd—for example, being obtained by patterning a metal layer of the die 220 with the mask being used at the corresponding stage of its production process. The rulers 230R and 230C are arranged at a corner of the die 220; particularly, the rulers 230R and 230C extend perpendicularly to each other (in parallel with corresponding borders of the die 220) from an origin pad 235.

Each ruler 230R and 230C is used to measure a linear distance from the origin pad 235 (along a straight line extending in parallel with the corresponding border of the die 220). For this purpose, each ruler 230R,230C is formed by an elongated spine 240R,240C and a plurality of teeth 245R,245C, which project transversally from the spine 240R,240C (outwards); a portion of the spine 240R,240C between each pair of adjacent teeth 245R,245C (or after a last tooth 245R,245C being distal from the reference pad 235) defines a corresponding inter-tooth 250R,250C. A separation pad 255R,255C splits the (global) ruler 230R, 230C into a shot ruler 230Rs,230Cs for the (shot) index 225Rs,225Cs and a die ruler 230Rd,230Cd for the (die) index 225Rd,225Cd; particularly, the ruler 230Rs,230Cs extends between the origin pad 235 and the separation pad 255R,255C, while the ruler 230Rd,230Cd extends from the separation pad 255R,255C away from the origin pad 235. The teeth 245R,245C and the inter-teeth 250R,250C of each ruler 230Rs, 230Rd, 230Cs, and 230Cd define an ordered alignment of locations thereof (referred to as dots), each one associated with a corresponding number; in the example shown in the figure, each ruler 230Rs,230Rd,230Cs,230Cd includes 15 dots (numbered from 1 to 15)—moving upwards from the origin pad 235 for the ruler 230Rs, upwards from the separation pad 255R for the ruler 230Rd, leftwards from the origin pad 235 for the ruler 230Cs, and leftwards from the separation pad 255C for the ruler 230Cd.

A marker 260Rs, 260Rd, 260Cs, and 260Cd is used to select a corresponding dot (and then its number) in the ruler 230Rs, 230Rd, 230Cs, and 230Cd, respectively. Each marker 260Rs,260Rd,260Cs,260Cd is defined by the erasure of the corresponding dot—i.e., the missing of the corresponding tooth 245R,245C or inter-tooth 250R,250C that exposes an opaque material (below the reflective material of the ruler 230Rs,230Rd,230Cs,230Cd). The markers 260Rd and 260Cd for the (die) indexes 225Rd and 225Cd, respectively, may be formed by selectively removing the metal layer of the corresponding rulers 230R and 230C with an additional mask (producing different markers 260Rd,260Cd in each die 220 of the shot area, with the same markers 260Rd,260Cd that are repeated in the same positions of the different shot areas); the markers 260Rs and 260Cs for the (shot) indexes 225Rs and 225Cs, respectively, may likewise be formed by selectively removing the metal layer of the corresponding rulers 230R and 230C with a suitable service mask that is slightly displaced at every shot (producing the same markers 260Rs,260Cs in all the dice 220 of the shot area, with the markers 260Rs,260Cs that change in the different shot areas). For example, in the figure the marker 260Rs selects the dot 11 (for the index 225Rs) and the marker 260Cs selects the dot 10 (for the index 225Cs)—so as to define the shot index (11,10); moreover, the marker 260Rd selects the dot 2 (for the index 225Rd) and the marker 260Cd selects the dot 4 (for the index 225Cd)—so as to define the die index (2,4).

Figure 3A:
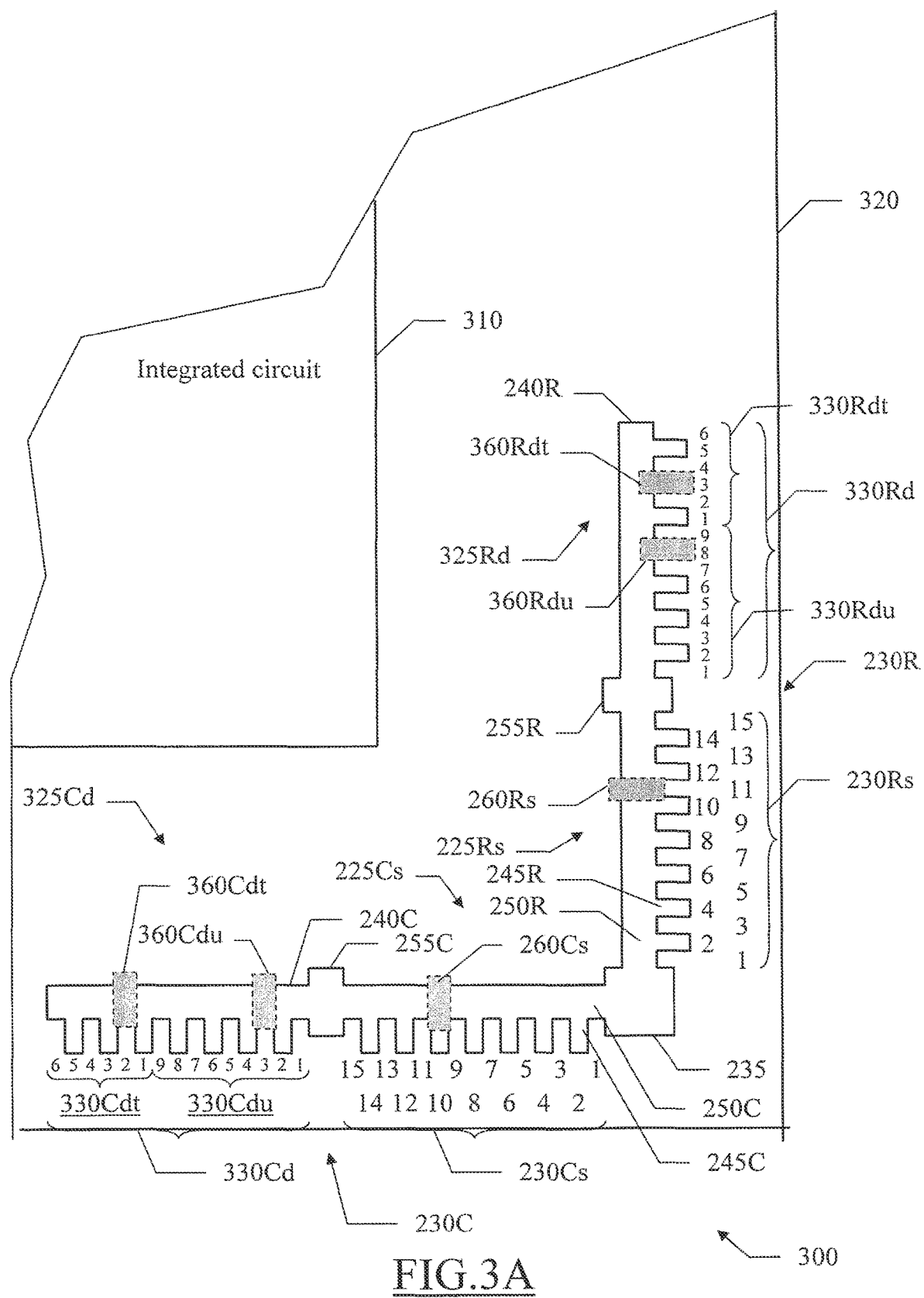
FIGS. 3A-3E show an enlarged portion of different examples of an electronic device implementing an indexing scheme according to an embodiment.

An enlarged portion of different examples of an electronic device 300 implementing an indexing scheme according to an embodiment is shown in FIG. 3A-FIG. 3E. With reference in particular to FIG. 3A, the electronic device 300 includes an integrated circuit 310 that is formed in a die 320; the position of the die 320 in the corresponding wafer (not shown in the figure) is indicated by a (global) index, which includes the same reference being formed by the rulers 230R and 230C. As above, the global index includes the (row shot) index 225Rs and the (column shot) index 225Cs. However, the global index now includes a (row die) index 325Rd and a (column die) index 325Cd each one defined by multiple markers, for corresponding digits that define a positional notation in a predefined base higher that 2.

In this way, it is possible to increase the maximum value of each index 325Rd and 325Cd, and then the range of the whole index 325Rd,325Cd, for the same size of the rulers 230Rd and 230Cd, respectively (or, vice-versa, it is possible to reduce the size of the rulers 230Rd and 230Cd for the same maximum value of the indexes 325Rd and 325Cd). The proposed solution thus allows indexing the dice 320 even when they are formed in large number in each shot area of the wafer (with a beneficial effect on the quality management of the corresponding production process).

It is emphasized that this result is achieved (by simply updating the control program of the stepper) without the need of modifying the rulers 230R and 230C. Therefore, the proposed solution only requires changing the mask for the new markers (whereas it is possible to continue using the other masks, with a corresponding reduction of the implementation cost).

Particularly, in an embodiment of the invention each index 325Rd,325Cd is defined by a number in a decimal notation (i.e., with the base is equal to 10). Each number in base 10 is represented with an ordered sequence (from the right to the left) of the digits, which can take any value from 0 to 10−1=9; the value of the number is then defined by the sum of its digit values, each one multiplied by a corresponding power of the base 10 ($10.^0$ for the first digit of the units, $10^1$ for the second digit of the tens, $10^2$ for the third digit of the hundreds, and so on). In the specific example at issue, the index 325Rd,325Cd includes two digits (one for the units and another one of the tens).

In order to represent the different digits of the index 325Rd,325Cd, the ruler 230Rd,230Cd is logically partitioned into a component 330Rdu,330Cdu (referred to as units ruler) for the units digits, and a component 330Rdt, 330Cdt (referred to as tens ruler) for the tens digits. The ruler 330Rdu,330Cdu includes 9 dots for all the possible non-null value of the units digits from 1 to 9; the ruler 330Rdt,330Cdt includes the remaining 6 dots for the first non-null values of the tens digits from 1 to 6.

A marker 360Rdu, 360Rdt, 360Cdu, and 360Cdt is used as above to select a corresponding dot in the ruler 330Rdu, 330Rdt, 330Cdu, and 330Cdt, respectively; each marker

360Rdu,360Rdt,360Cdu,360Cdt then selects the corresponding digit value 1-9, while the digit value 0 is represented by the lacking of the marker 360Rdu,360Rdt, 360Cdu,360Cdt in the ruler 330Rdu,330Rdt,330Cdu, 330Cdt. Particularly, the marker 360Rdu,360Cdu selects the units digit of the index 325Rd,325Cd, while the marker 360Rdt,360Cdt selects the tens digit of the index 325Rd, 325Cd. Therefore, in the specific example at issue (wherein the tens digit value ranges from 0 to 6), the index 325Rd, 325Cd can take any value from 0 to 69. The proposed implementation thus increases the maximum value of the index 325Rd,325Cd (for the same ruler 230Rd,230Cd), with respect to the above-described indexing techniques known in the art being based on a single marker, by (69−15)/16=360%. For example, in the figure the marker 360Rdu selects the dot of the units digit value 8, while the marker 360Rdt selects the dot of the tens digit 3—so as to define the index 325Rd=38; likewise, the marker 360Cdu selects the dot of the units digit value 3, while the marker 360Cdt selects the dot of the tens digit value 2—so as to define the index 325Cd=23.

Figure 3B:
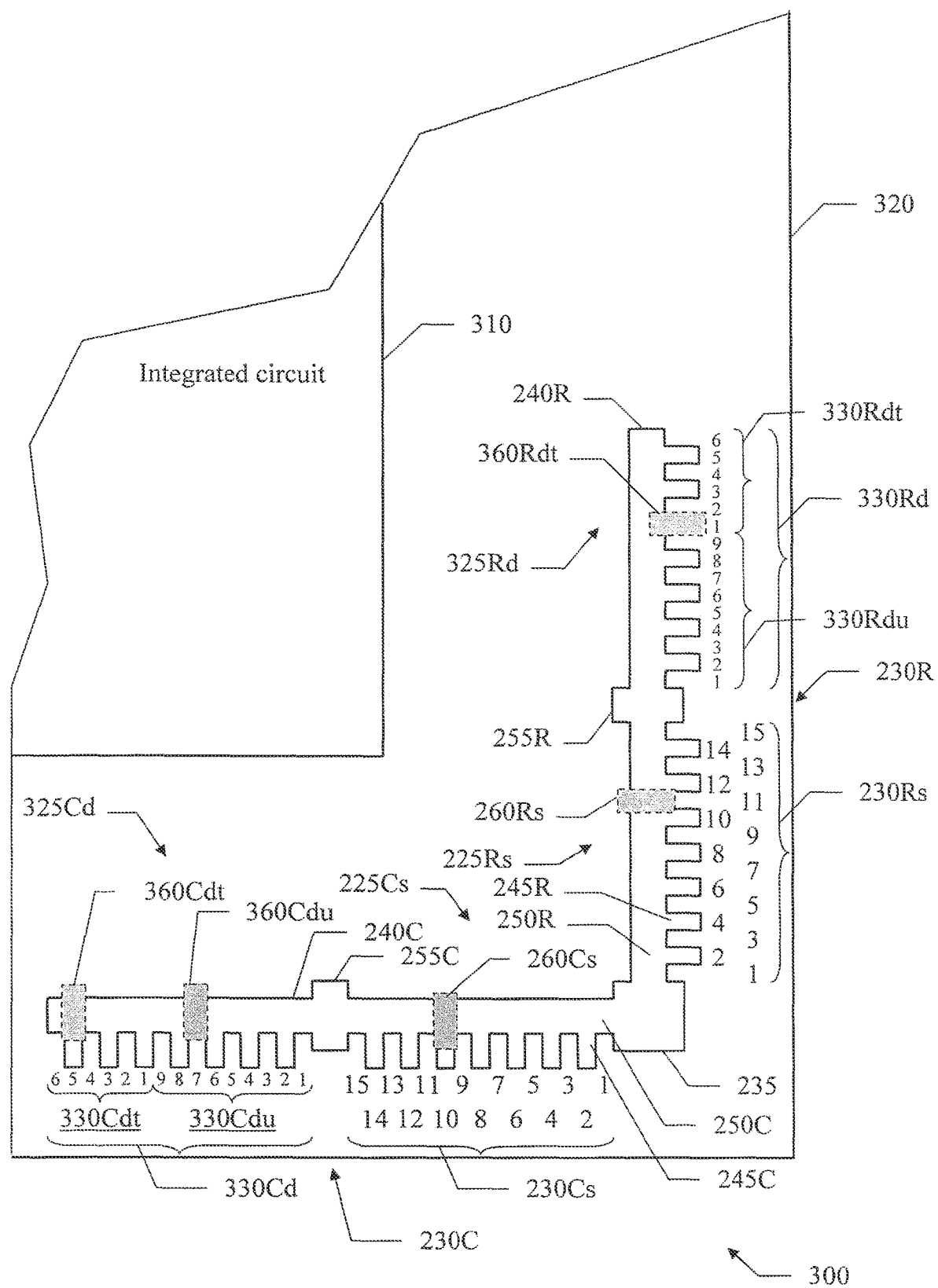

A different value of the index 325Rd,325Cd of the same die 300 is illustrated in FIG. 3B. In this case, the marker for the ruler 330Rdu is lacking to select the units digit value 0, while the marker 360Rdt selects the dot of the tens digit value 1—so as to define the index 325Rd=10; the marker 360Cdu instead selects the dot of the units digit value 7, while the marker 360Cdt selects the dot of the tens digit value 5—so as to define the index 325Cd=57.

Figure 3C:
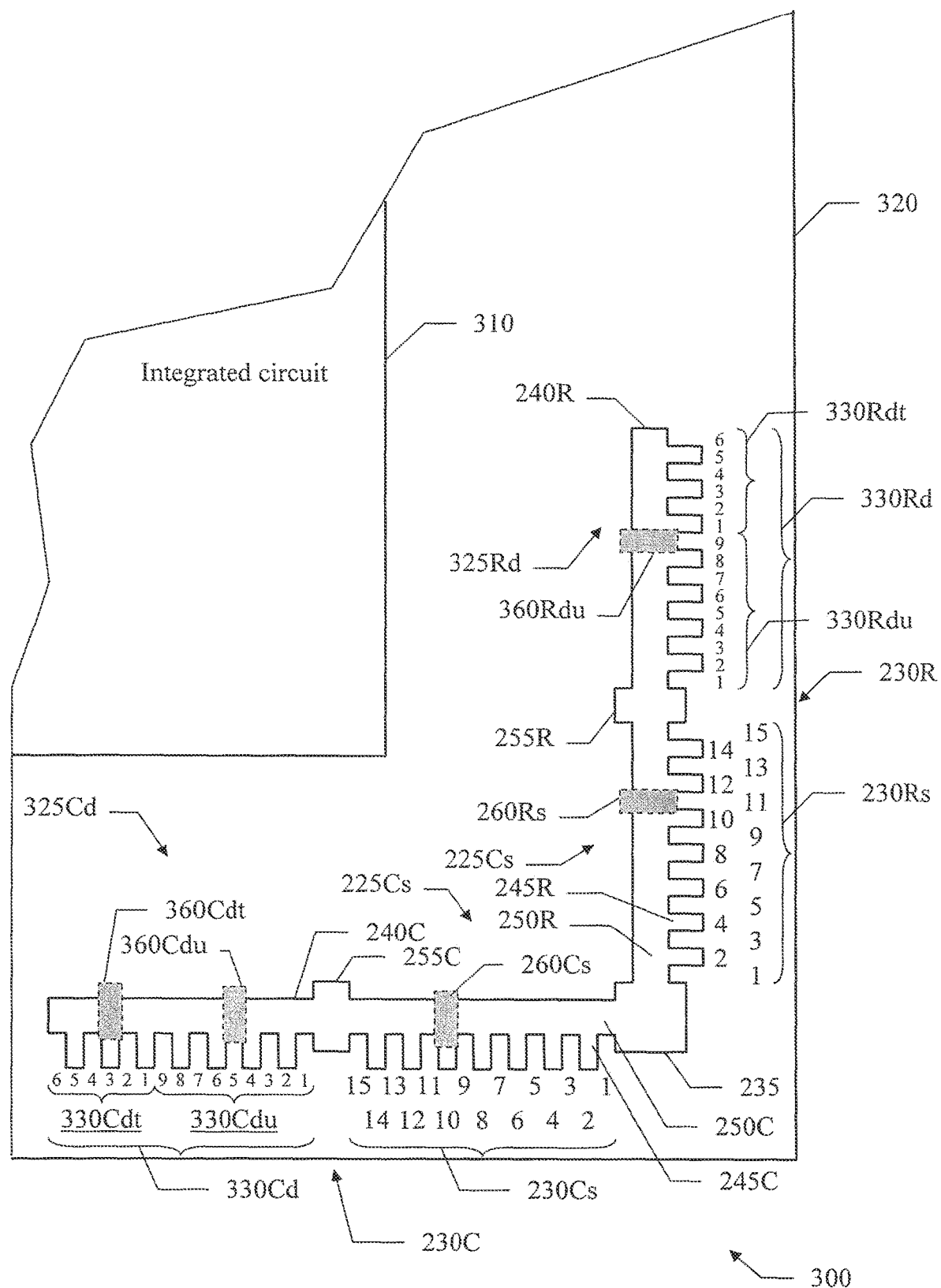

Moving to FIG. 3C, the marker 360Rdu selects the dot of the units digit value 9, while the marker for the ruler 330Rdt is lacking to select the tens digit value 0—so as to define the index 325Rd=9; the marker 330Cdu selects the dot of the units digit value 5, while the marker 360Cdt selects the dot of the tens digit value 3—so as to define the index 325Cd=35.

Figure 3D:
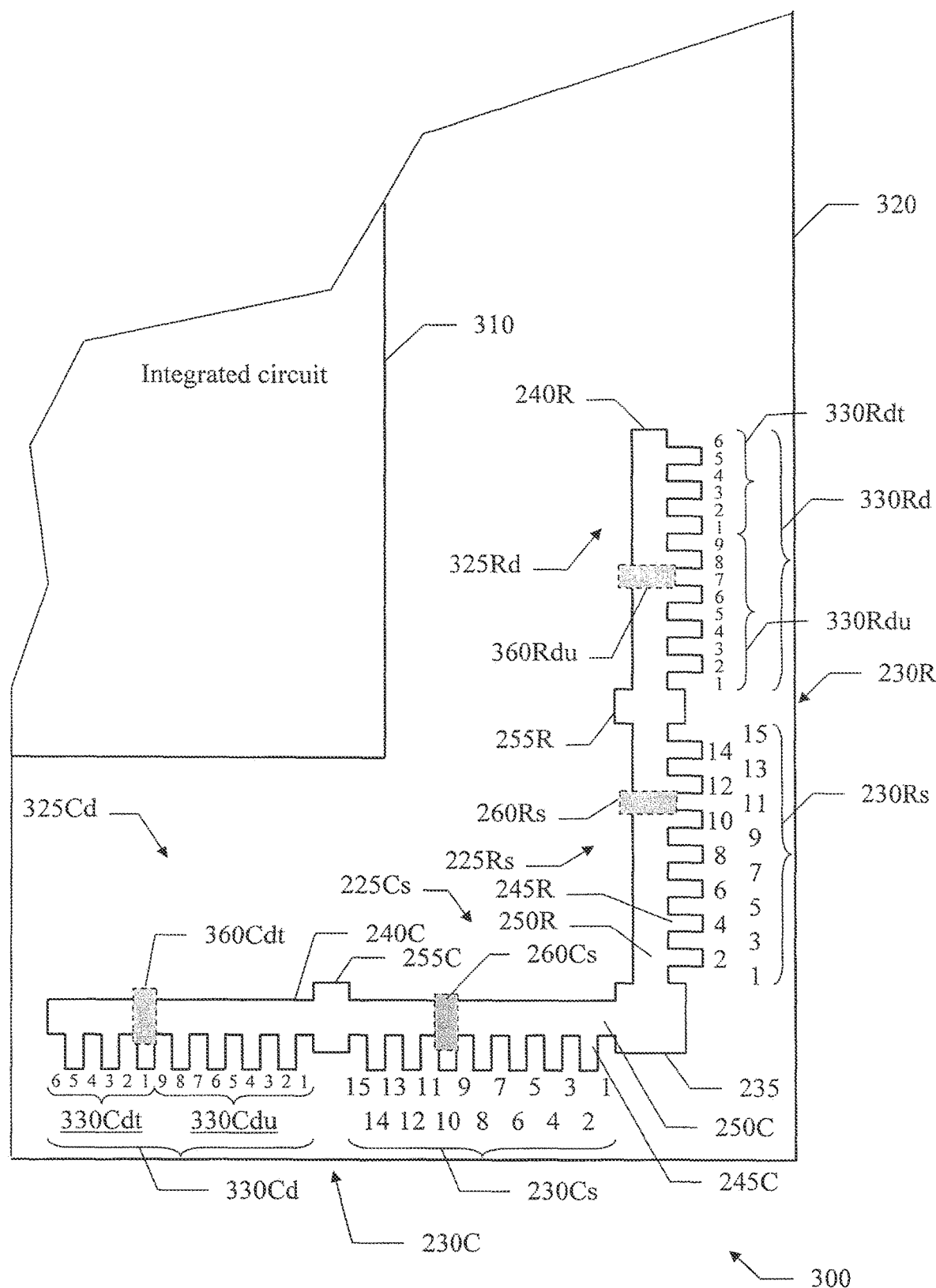

With reference to FIG. 3D, the marker 360Rdu selects the dot of the units digit value 7, while the marker for the ruler 330Rdt is lacking to select the tens digit 0—so as to define the index 325Rd=7; the marker for the ruler 330Cdu is lacking to select the units digit value 0, while the marker 360Cdt selects the dot of the tens digit value 1—so as to define the index 325Cd=10. In this specific case (i.e., when both the indexes 325Rd and 325Cd are lower than or equal to 10) a single marker (i.e., for the units digits for values from 1 to 9, or for the tens digits for the value 10) is present in each ruler 330Rd,330Cd; therefore, the indexing of the die 320 is exactly the same as in the dice known in the art.

Figure 3E:
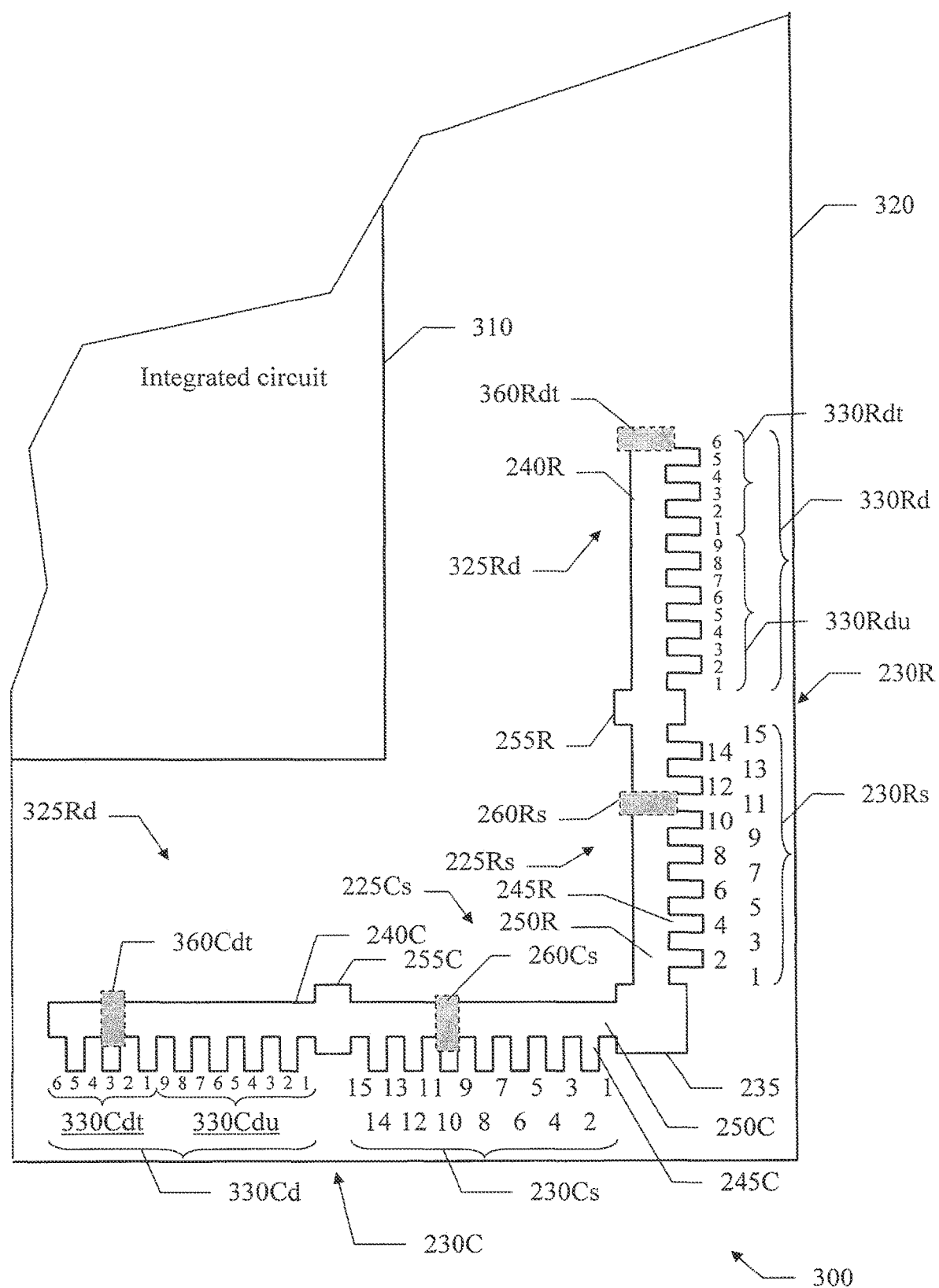

At the end, in FIG. 3E the marker for the ruler 330Rdu is lacking to select the units digit value 0, while the marker 360Rdt selects the dot of the tens digit value 6—so as to define the index 325Rd=60; the marker for the ruler 330Cdu is likewise lacking to select the units digit value 0, while the marker 360Cdt selects the dot of the tens digit value 3—so as to define the index 325Cd=30. In this specific case (i.e., when both the indexes 325Rd and 325Cd are equal to a power of 10 being 2) a single marker for the tens digits is present in each ruler 330Rd,330Cd; therefore, the index 325Rd,325Cd has again exactly the same structure as in the dice known in the art, but it is now decoded in a different way.

As a further improvement, it is also possible to encrypt the index with a (secret) encryption key; in this way, the position of the die in the wafer can be recovered only by decrypting the index with the encryption key. This additional feature avoids making the position of the die public, so that this information is available only to authorized persons knowing the encryption key.

Particularly, in an embodiment the index is encrypted with a simple substitution algorithm, wherein each digit value of the index is replaced with another digit value according to a (secret) substitution alphabet—i.e., with each digit value Di (with i from 0 to the base of the positional notation minus 1) that is replaced with the $i^{th}$ digit value in the substitution alphabet. For example, the substitution alphabet 5942610387 indicates that the digit values 0, 1, 2, 3, 4, 5, 6, 7, 8 and 9 are replaced by the digit values 5, 9, 2, 4, 6, 1, 0, 3, 8 and 7, respectively:

0 1 2 3 4 5 6 7 8 9
5 9 4 2 6 1 0 3 8 7

Therefore, as an example, the index value 50 is encrypted to 15. The same operations described above are then repeated in reverse order to recover the actual value of the index from its encrypted version; for example, a row die index equal to 32 and a column die index equal to 07 indicates that the die is at the 73th row and at the 69th column in the corresponding shot area.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if each electronic device has a different structure or includes equivalent components (either separate to each other or combined together, in whole or in part); particularly, the electronic device may be of the micro-mechanical type, of the opto-electronic type, and the like; the electronic device may also be in the form of a package (including one or more dice), or even in the form of a mere bare die.

Moreover, the wafer may be made of another material or it may include a different number of dice. Likewise, the indexes may be formed in another position on the die or with other techniques (for example, with direct writing techniques by means of a laser); the indexes may also be inspected with alternative procedures (even when they are not optically visible)—for example, by means of electromagnetic radiations (such as X-rays, infrared or ultraviolet light), or particle beams (such as electron beams).

Even though in the preceding description reference has been made to two markers for each ruler, this is not to be interpreted in a limitative manner (with the same concepts that also apply to three or more markers).

Similar considerations apply if the indexes have a different range (for example, by providing a different number of dots for the tens digits, or even by adding further dots for the hundred digits, and so on). The same technique may also be applied to indexes that are represented with numbers in any other positional notation with any base higher than 2.

Consequently, the portion of the ruler dedicated to each marker may include any number (>=2) of adjacent locations (down to 2 locations for the digit values 1 and 2 when the base is equal to 3 and the digit value 0 is represented by the lacking of the corresponding marker). An alternative implementation is also feasible wherein the markers have different representations on a common ruler (for example, with the marker for the units digits and the marker for the tens digits that are arranged at opposite sides of the ruler).

Nothing prevents providing a specific dot for the digit 0 as well. Moreover, in a different implementation of the invention, 10 dots are used for the units digits (from 1 to 10); in this case, the values of the index up to 10 are represented only by the units marker, with the tens marker that is then used for higher values thereof.

The above-described implementation of the indexes based on the rulers is merely illustrative, and it should not be interpreted in a limitative manner; indeed, similar considerations apply if the indexes are simply defined by the distance of the markers from a predefined reference (which may also comprise of an edge of the die).

More generally, the ruler may be implemented with any other structure capable of measuring a linear distance from a corresponding origin indicator, which ruler is provided with distance indicators in a straight linear arrangement from the origin indicator, each one defining a corresponding location of the ruler; for example, the ruler may be implemented with the ruler may be implemented with a sequence of small segments each one representing a corresponding dot). Likewise, the markers may be defined in any other way, for example, by deleting all the dots up to the selected one, or by any other sign that is added to the ruler (for example, in the form of a cross).

In addition or in alternative, the same technique may also be applied to the shot index. In any case, the proposed solution lends itself to be used in standard production processes as well (wherein all the dice are formed concurrently in the whole wafer).

Similar considerations apply if each index has a different structure (for example, comprising of a single number that directly defines the position of the die in the wafer).

Moreover, the indexes may be encrypted with any other algorithm (for example, based on a shifted or reversed substitution, of the transposition type, and the like); naturally, this feature is merely optional and in no way limitative.

It should be readily apparent that the proposed structure might be part of the design of the corresponding integrated circuits. The design may also be created in a programming language; moreover, if the designer does not fabricate dice or masks, the design may be transmitted by physical means to others.

Moreover, the proposed electronic device may be mounted in intermediate products (such as mother boards), and/or coupled with one or more other electronic devices (such as a processor or a memory). In any case, the electronic device is suitable to be used in complex systems (such as mobile telephones).

The proposed solution lends itself to be implemented with an equivalent method (by using similar steps, removing some steps being non-essential, or adding further optional steps); moreover, the steps may be performed in a different order, concurrently or in an interleaved way (at least in part).

The above-described solution may be implemented as a stand-alone module, as a plug-in for the control program of the stepper, or even directly in the control program itself.

Moreover, the control program may take any form suitable to be used by the control unit of the stepper (or by any other data processing system) or in connection therewith. In any case, the solution according to an embodiment of the present invention lends itself to be implemented even with a hardware structure (for example, integrated in a chip of semiconductor material), or with a combination of software and hardware.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electronic device, comprising:
a die having a positional location in a shot defined by first and second die coordinates, wherein the shot has a positional location in a wafer defined by first and second shot coordinates, wherein the first die coordinate identifies a horizontal location in the shot where the die was formed, wherein the second die coordinate identifies a vertical location in the shot where the die was formed, wherein the first shot coordinate identifies a horizontal location on the wafer where the shot resides, wherein the second shot coordinate identifies a vertical location on the wafer where the shot resides;
a first comb structure comprising a first spine with a first plurality of teeth projecting transversally therefrom, and wherein portions of the first spine between pairs of adjacent teeth of the first plurality of teeth define first inter-tooth portions, the first plurality of teeth and first inter-tooth portions defining a first contiguous arrangement of first dots,
a second comb structure comprising a second spine with a second plurality of teeth projecting transversally therefrom, and wherein portions of the second spine between pairs of adjacent teeth of the second plurality of teeth define second inter-tooth portions, the second plurality of teeth and second inter-tooth portions defining a second contiguous arrangement of second dots,
a first marker at a selected one of the first dots, the first marker indicating a first digit of a two digit number for the first die coordinate,
a first additional marker at a selected one of the first dots, the first additional marker indicating a second digit of the two digit number for the first die coordinate,
a second marker at a selected one of the second dots, the second marker indicating a first digit of a two digit number for the second die coordinate, and
a second additional marker at a selected one of the second dots, the second additional marker indicating a second digit of the two digit number for the second die coordinate.

2. The electronic device of claim 1, wherein first dots and the second dots are arranged in a linear configuration.

3. The electronic device of claim 1, wherein the first digit of the first die coordinate has a units weight for the two digit number and the second digit of the first die coordinate has a tens weight for the two digit number; and wherein the first digit of the second die coordinate has a units weight for the two digit number and the second digit of the second die coordinate has a tens weight for the two digit number.

4. The electronic device of claim 3, wherein a lack of the first marker or first additional marker indicates a null or zero value of the first or second digit of the first die coordinate, respectively; and wherein a lack of the second marker or second additional marker indicates a null or zero value of the first or second digit of the second die coordinate, respectively.

5. The electronic device of claim 1, wherein the first and/or second comb structure includes an origin pad.

6. The electronic device of claim 1, wherein the first marker indicates an encrypted first digit of the first die coordinate and wherein the first additional marker indicates an encrypted second digit of the first die coordinate; and wherein the second marker indicates an encrypted first digit of the second die coordinate and wherein the second additional marker indicates an encrypted second digit of the second die coordinate.

7. The electronic device of claim 1, further comprising:
a third comb structure comprising a third spine with a third plurality of teeth projecting transversally therefrom, and wherein portions of the third spine between pairs of adjacent teeth of the third plurality of teeth define third inter-tooth portions, the third plurality of teeth and the third inter-tooth portions defining a third contiguous arrangement of third dots,
a first separation pad connecting the first and third spines;
a fourth comb structure comprising a fourth spine with a fourth plurality of teeth projecting transversally therefrom, and wherein portions of the third spine between pairs of adjacent teeth of the fourth plurality of teeth define fourth inter-tooth portions, the fourth plurality of teeth and the fourth inter-tooth portions defining a fourth contiguous arrangement of fourth dots;
a second separation pad connecting the second and fourth spines;
a third marker at a selected one of the third dots, the third marker indicating a digit number of the first shot coordinate; and
a fourth marker at a selected one of the fourth dots, the fourth marker indicating a digit number of the second shot coordinate.

8. A method, comprising:
forming dice in a wafer, with each die having a positional location in a shot defined by first and second die coordinates, wherein each shot has a positional location in the wafer defined by first and second shot coordinates, wherein the first die coordinate identifies a horizontal location of the die in the shot, wherein the second die coordinate identifies a vertical location of the die in the shot, wherein the first shot coordinate identifies a horizontal location on the wafer where the shot resides, wherein the second shot coordinate identifies a vertical location on the wafer where the shot resides; and
forming a first comb structure on each die and comprising a first spine with a first plurality of teeth projecting transversally therefrom, and wherein portions of the first spine between pairs of adjacent teeth of the first plurality of teeth define first inter-tooth portions, the first plurality of teeth and first inter-tooth portions defining a first contiguous arrangement of first dots at each die location on the wafer,
forming a second comb structure on each die and comprising a second spine with a second plurality of teeth projecting transversally therefrom, and wherein portions of the second spine between pairs of adjacent teeth of the second plurality of teeth define second inter-tooth portions, the second plurality of teeth and second inter-tooth portions defining a second contiguous arrangement of second dots on the wafer,
placing a first marker at a selected one of the first dots, the first marker indicating a first digit of a two digit number for the first die coordinate,
placing a first additional marker at a selected one of the first dots, the first additional marker indicating a second digit of the two digit number for the first die coordinate,
placing a second marker at a selected one of the second dots, the second marker indicating a first digit of a two digit number for the second die coordinate, and
placing a second additional marker at a selected one of the second dots, the second additional marker indicating a second digit of the two digit number for the second die coordinate.

9. The method of claim 8, wherein first dots and the second dots are arranged in a linear configuration.

10. The method of claim 9, wherein the first digit of the first die coordinate has a units weight for the two digit number and the second digit of the first die coordinate has a tens weight for the two digit number; and wherein the first digit of the second die coordinate has a units weight for the two digit number and the second digit of the second die coordinate has a tens weight for the two digit number.

11. The method of claim 10, wherein a lack of the first marker or first additional marker indicates a null or zero value of the first or second digit of the first die coordinate, respectively; and wherein a lack of the second marker or second additional marker indicates a null or zero value of the first or second digit of the second die coordinate, respectively.

12. The method of claim 9, wherein the first and second comb structure each include an origin pad; wherein a value of the first die coordinate is based on a distance of the first marker and first additional marker from the origin pad of the first comb structure; and wherein the value of the second die coordinate and second shot coordinate is based on a distance of the second marker and second additional marker from the origin pad of the second comb structure.

13. A method for indexing electronic devices, comprising the steps of:
integrating a plurality of electronic circuits into portions of a wafer for corresponding dice, each die having a specific die location in the wafer;
forming at least one index on each die, each index including a reference defining an ordered alignment of a plurality of locations on the die and marker means for defining a value of the die location according to an arrangement of the marker means with respect to the reference, the value of the index indicating the specific die location of the die in the wafer; and
cutting the dice for forming electronic devices;
wherein the step of forming at least one index includes, for each index, forming a plurality of markers each one arranged at a selected one of the locations, the selected location of the marker defining a value of a digit associated with a corresponding power of a base higher than 2 within a number in a positional notation in said base representing the value of the index.

14. The method according to claim 13, wherein the ordered alignment of the locations is logically partitioned into a plurality of location subsets each one comprising of a plurality of consecutive locations for a corresponding marker, the step of forming at least one index on each die including forming each marker in a location of a corresponding location subset.

15. The method according to claim 13, wherein the step of forming at least one index on each die includes not forming a corresponding marker for defining a null value of each digit.

16. The method according to claim 13, wherein the step of forming at least one index on each die includes:
forming a reference of each index to include an origin indicator and a plurality of distance indicators extending along a straight line from the origin indicator, each distance indicator defining a corresponding location of the reference.

17. The method according to claim 16, wherein the step of forming a reference of each index includes:
forming the reference to include a comb-like structure having a spine and a plurality of teeth projecting from the spine, each portion of the spine between a pair of adjacent teeth defining a corresponding inter-tooth, each tooth and each inter-tooth identifying a corresponding location of the reference, and
wherein the step of forming a plurality of markers includes forming each marker to include of either a missing tooth or a missing inter-tooth.

18. The method according to claim 13, wherein the step of integrating a plurality of electronic circuits includes:
making a die subset comprising of a predetermined number of the dice concurrently in each one of a plurality of shot areas of the wafer, the die subsets being made in succession in the wafer, and
wherein the step of forming at least one index on each die includes setting the value of the at least one index to indicate a die location of the die in the corresponding shot area.

19. The method according to claim 18,
wherein the step of making a die subset includes:
arranging the dice of the die subset in a matrix having a plurality of rows and a plurality of columns; and
wherein the step of forming at least one index) on each die includes:
forming a row index and a column index, the row index being indicative of the row of the die in the matrix and the column index being indicative of the column of the die in the matrix.

20. The method according to claim 13, wherein the step of forming at least one index on each die includes encrypting a value of each index with an encryption key.

21. An electronic device, comprising:
a die having a positional location within a shot defined by first and second two digit die coordinate values, wherein the first two digit die coordinate value identifies a horizontal location within the shot where the die was formed, and wherein the second two digit die coordinate value identifies a vertical location within the shot where the die was formed; and
an index formed on the die, the index comprising:
a first comb structure comprising a first contiguous arrangement of first dots,
a second comb structure comprising a second contiguous arrangement of second dots,
a first marker at a first selected one of the first dots, the first marker specifying a first digit of the first two digit die coordinate value,
a second marker at a second selected one of the first dots, the second marker specifying a second digit of the first two digit die coordinate value,
a third marker at a first selected one of the second dots, the third marker specifying a first digit of the second two digit die coordinate value, and
a fourth marker at a second selected one of the second dots, the fourth marker specifying a second digit of the second two digit die coordinate value.

22. The electronic device of claim 21, wherein the first dots are located at teeth or spaces between teeth in the first comb structure; and wherein the second dots are located at teeth or spaces between teeth in the second comb structure.

23. The electronic device of claim 21, wherein each first digit specifies a units weight for the two digit die coordinate value and each second digit specifies a tens weight for the two digit die coordinate value.

24. The electronic device of claim 21, wherein absence of one of the first through fourth markers indicates a null value of the corresponding first or second digit.

* * * * *